(12) United States Patent  
Choy et al.

(10) Patent No.: US 9,048,104 B2  
(45) Date of Patent: Jun. 2, 2015

(54) MULTI-CHIP PACKAGE MODULE AND A DOPED POLYSILICON TRENCH FOR ISOLATION AND CONNECTION

(75) Inventors: Benedict C. K. Choy, Cupertino, CA (US); Ching Chu, San Jose, CA (US); Haibing (Robin) Liu, Fremont, CA (US); Ming-Yuan Yeh, Mountain View, CA (US)

(73) Assignee: Microchip Technology Inc., Chandler, AZ (US)

( * ) Notice: Subject to any disclaimer, the term of this patent is extended or adjusted under 35 U.S.C. 154(b) by 276 days.

(21) Appl. No.: 12/834,853

(22) Filed: Jul. 12, 2010

(65) Prior Publication Data

US 2012/0007216 A1 Jan. 12, 2012

(51) Int. Cl.
*H01L 29/40* (2006.01)
*H01L 23/00* (2006.01)
*H01L 23/495* (2006.01)
*H01L 23/525* (2006.01)
*H01L 29/08* (2006.01)
*H01L 29/66* (2006.01)
*H01L 29/78* (2006.01)

(52) U.S. Cl.
CPC .......... *H01L 24/06* (2013.01); *H01L 23/49575* (2013.01); *H01L 23/525* (2013.01); *H01L 24/29* (2013.01); *H01L 29/0878* (2013.01); *H01L 29/66712* (2013.01); *H01L 29/7809* (2013.01); *H01L 2224/05553* (2013.01); *H01L 2224/05599* (2013.01); *H01L 2224/48135* (2013.01); *H01L 2224/48137* (2013.01); *H01L 2224/48247* (2013.01); *H01L 2224/49171* (2013.01); *H01L 2224/73265* (2013.01); *H01L 2224/85399* (2013.01); *H01L 2924/01014* (2013.01); *H01L 2924/01082* (2013.01); *H01L 2924/07802* (2013.01); *H01L 2924/10329* (2013.01); *H01L 24/48* (2013.01); *H01L 24/49* (2013.01); *H01L 2224/32245* (2013.01); *H01L 2924/00014* (2013.01); *H01L 2924/01005* (2013.01); *H01L 2924/01033* (2013.01); *H01L 2924/01075* (2013.01); *H01L 2924/1305* (2013.01)

(58) Field of Classification Search
USPC .......... 257/578, 666–798, E23.031, E23.042, 257/E23.052–E23.066
See application file for complete search history.

(56) References Cited

U.S. PATENT DOCUMENTS

| | | | | |
|---|---|---|---|---|
| 5,789,816 | A * | 8/1998 | Wu | 257/723 |
| 6,333,549 | B2 * | 12/2001 | Drehobl et al. | 257/666 |
| 8,049,321 | B2 * | 11/2011 | Huang et al. | 257/686 |
| 2003/0006453 | A1 * | 1/2003 | Liang et al. | 257/328 |
| 2009/0189261 | A1 * | 7/2009 | Lim et al. | 257/676 |
| 2010/0230790 | A1 * | 9/2010 | Disney | 257/666 |

* cited by examiner

*Primary Examiner* — David Vu
*Assistant Examiner* — Cuong Nguyen
(74) *Attorney, Agent, or Firm* — Brent Yamashita; DLA Piper LLP US

(57) ABSTRACT

A circuit module comprises a die attach pad with a surface and a plurality of leads surrounding the surface. A nonconductive adhesive is on the surface. A plurality of electronic circuit dies are on the surface of the die attach pad. Each die has a top surface and a bottom surface with the bottom surface on the adhesive. The top surface has a plurality of bonding pads. A first electronic circuit die has at least one routing path of a conductive material connecting a first bonding pad to a second bonding pad. A first bonding wire connects a bonding pad of a second electronic circuit die to the first bonding pad of the first electronic die. A second bonding wire connects the second bonding pad of the first electronic circuit die to a lead. Where one of the dies contains vertical circuit element, where a doped layer forms a terminal along the bottom surface of the layer, a trench filled with doped polysilicon extends from the top surface to the terminal to connect to the terminal. The doped polysilicon filled trench also serves to isolate and separate different circuit elements.

6 Claims, 3 Drawing Sheets

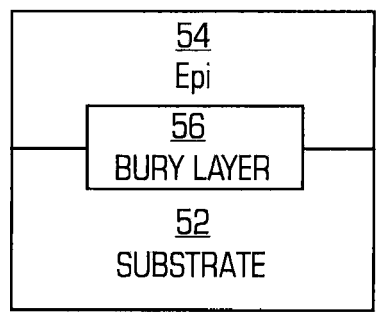
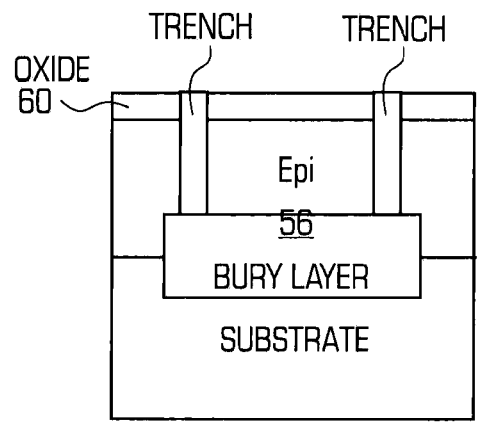
FIG. 5(a)　　　　　　　FIG. 5(b)
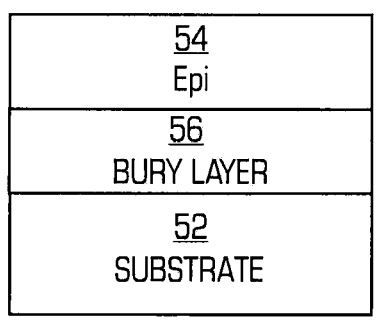
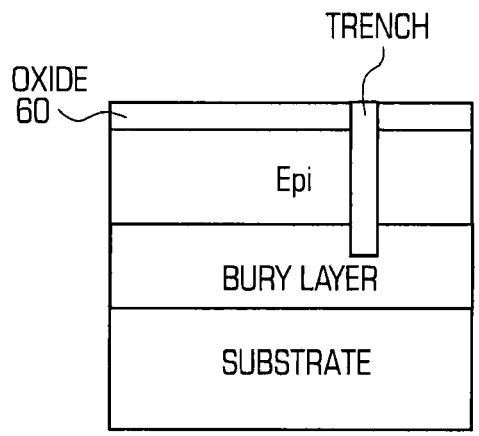
FIG. 6(a)　　　　　　　FIG. 6(b)

US 9,048,104 B2

MULTI-CHIP PACKAGE MODULE AND A DOPED POLYSILICON TRENCH FOR ISOLATION AND CONNECTION

TECHNICAL FIELD

The present invention relates to a multi-chip package module in which an intra-chip signal routing path is used to facilitate the connection of a wire bond from one chip across another chip to a lead. The present invention also relates to a doped polysilicon trench for use either as a connection to a buried layer or substrate in a vertical circuit component or as an isolation structure.

BACKGROUND OF THE INVENTION

Multi-chip packaged modules are well known in the art. In a multi-chip packaged module, a plurality of integrated circuit dies are placed on a surface of a die attach pad, which is surrounded by leads. Each die has a plurality of bonding pads. Electrical leads, such as wire bonds, connect certain bonding pads of the dies to certain leads, surrounding the die attach pad. In the prior art, if two dies are to be packaged side by side, and if an electrical connection is desired to connect the bonding pad of a first die, which is located to one side of a second die, to a lead which is on the other side of the second die, the bonding wire has to cross over the second die. This can lead to several problems. First, the wire bond must be lengthy. Second, by crossing the wire bond over the second die, the wire bond may interfere electrically with the operation of the circuit elements on the second die. Finally, if not done carefully, the wire bond may even short to other electrical terminals (including other wire bonds) over the second die. Further, in some cases, due to the presence of the adjacent die, it may not even be possible to cross the wire bond over the adjacent die.

A further problem with the prior art is if one of the dies contains a vertically oriented circuit element, such as a bipolar transistor or a vertical DMOS transistor. In that event, the bottom surface of that die is a terminal, and must be connected to a voltage other than ground. Thus, the dies cannot be connected on the same die attach pad (which is typically made of a metal), due to the potential differences between the bottom surfaces of the dies.

One prior art solution is to use multiple die attach pads, with each die attach pad for a different die, and the multiple die attach pads are then packaged in a single package. Another prior art solution is to create a re-distribution layer (RDL) with the bonding pads of the different dies connected to the RDL, and the RDL re-muting the signals to different circuit elements. Finally, another prior art solution is to connect the dies on a printed circuit board (PCB) with the PCB packaged in a die attach pad. Clearly all of these prior art solutions are expensive.

In the prior art, it is also well known to use oxide filled trenches to isolate circuit elements. In addition, through substrate vias (TSV) filled with metal have also been used to route signals from the back side of a die to the front side. Finally, junction diffusion isolation has been used to isolate circuit elements on the same die from one another.

Therefore, one object of the present invention is to reduce the cost of multi-chip packaging, and in particular to reduce the cost for a multi-chip packaging of multiple dies, where one of the dies contains a vertical circuit element.

SUMMARY OF THE INVENTION

Accordingly, in the present invention, a circuit module comprises a die attach pad with a surface and a plurality of leads surrounding the surface. A nonconductive adhesive is on the surface. A plurality of electronic circuit dies are attached to the nonconductive adhesive on the surface of the die attach pad. Each die has a top surface and a bottom surface with the bottom surface on the adhesive. The top surface has a plurality of bonding pads. A first electronic circuit die has at least one muting path of a conductive material connecting a first bonding pad to a second bonding pad. A first bonding wire connects a bonding pad of a second electronic circuit die to the first bonding pad of the first electronic die. A second bonding wire connects the second bonding pad of the first electronic circuit die to a lead.

The present invention also relates to a semiconductor device which comprises a silicon layer of substantially single crystal, and has a bottom surface and a top surface. A doped layer forms a terminal along the bottom surface of the layer. A trench filled with doped polysilicon extends from the top surface to the terminal.

The present invention also relates to a semiconductor device that comprises a silicon layer of substantially single crystal, with a bottom surface and a top surface. A plurality of vertical circuit components are in the layer between the top surface and the bottom surface. A trench filled with doped polysilicon extends from the top surface to the bottom surface and isolates and separates the plurality of circuit components from one another.

BRIEF DESCRIPTION OF THE DRAWINGS

FIG. 5(a) is a cross-sectional view of a second embodiment of a die with which the polysilicon trench of the present invention may be used for isolation.

FIG. 5(b) is a cross-section view of the trench of the present invention connected to the buried layer in the die shown in FIG. 5(a) for isolation.

FIG. 6(a) is a cross-sectional view of a third embodiment of a die with which the polysilicon trench of the present invention may be used.

FIG. 6(b) is a cross-section view of the trench of the present invention connected to the buried layer in the die shown in FIG. 6(a).

DETAILED DESCRIPTION OF THE PREFERRED EMBODIMENT

Figure 1:
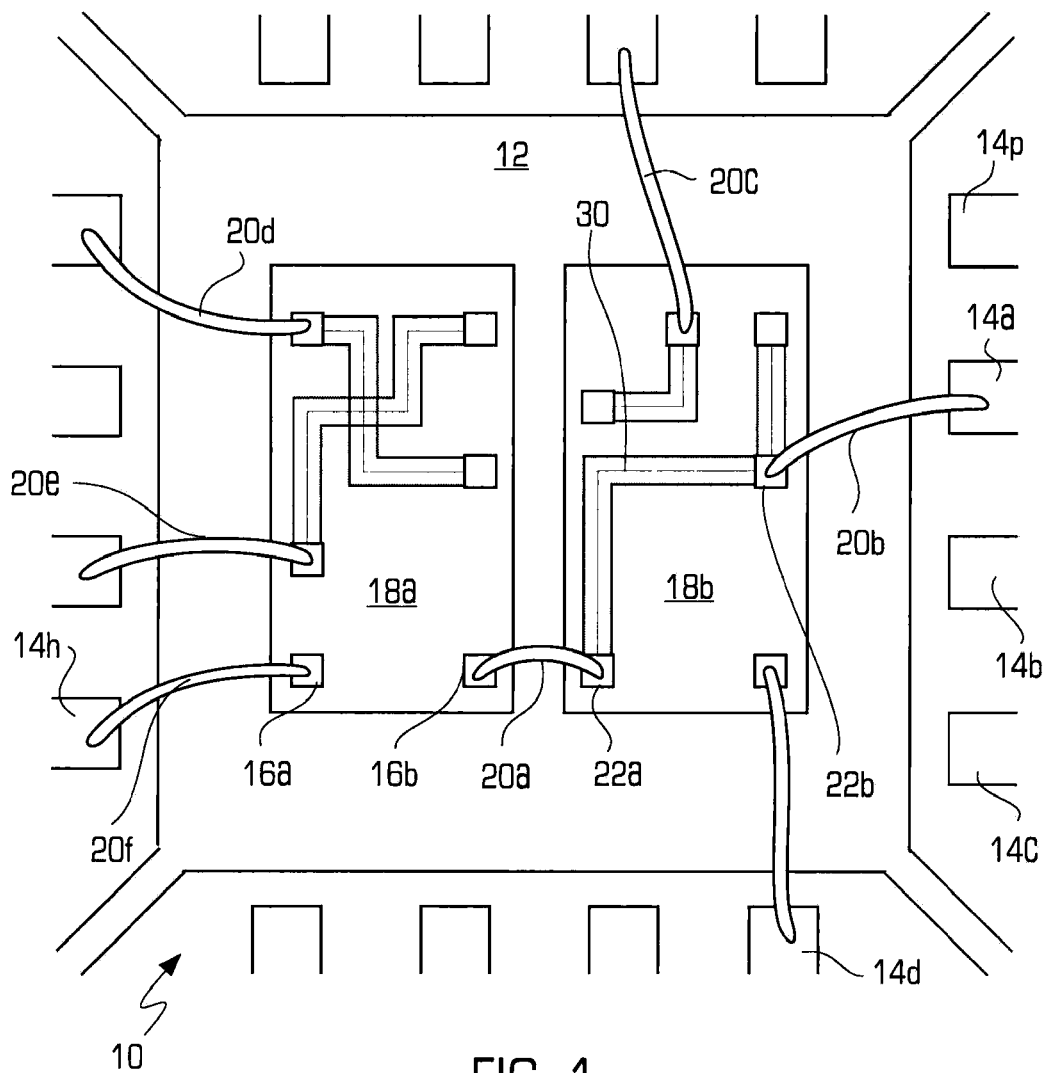
FIG. 1 is a top view of a multi-chip package module of the present invention.
Figure 2:
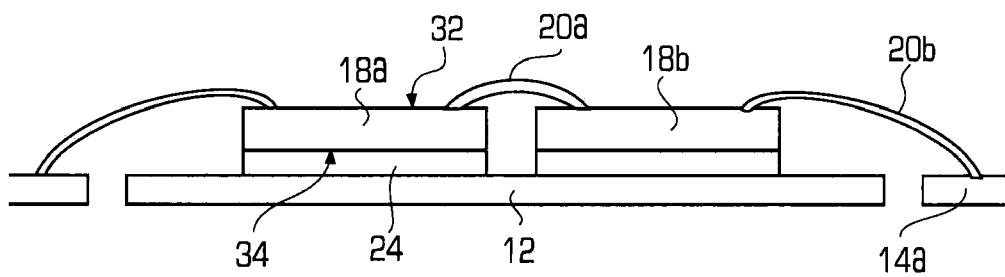
FIG. 2 is a side view of the module of the present invention shown in FIG. 1.

Referring to FIG. 1 there is shown a top view of the multi-chip packaged module 10 of the present invention. The module 10 comprises a die attach pad 12 having a surface 12 surrounded by a plurality of leads 14 (a-p). The leads 14 surround the surface 12. Two dies 18a and 18b are shown, although the present invention is not limited to two dies. Each die 18, as will be described hereinafter, comprises at least one circuit element. Each die 18 has a top surface 32 and a bottom surface 34. On the top surface 32 are a plurality of bonding pads, e.g. 16a and 16b for die 18a. The dies 18a and 18b are attached to the surface 12 of the die attach pad along the bottom surface 34 of the die 18 with a layer of non-conductive adhesive 24 between the bottom surface 34 and the surface 12 of the die attach pad. As is well know in the art, wire bonds, such as 20c, 20d and 20e, connect various bonding pads of the die 18 to the leads 14.

In the present invention, die 18b further comprises a signal routing layer 30, on the top surface 32 of die 18b. The routing layer 30 connects a bonding pad 22a of the die 18b to the bonding pad 22b. Thus, routing layer 30 does not connect to any of the electrical components in the die 18b, and is used solely to route signals. In the preferred embodiment, the bonding pad 22a is located near a side surface which is on one side of the die 18b, while the bonding pad 22b is near a side surface of the die 18b which is opposite to that of the bonding pad 22a. Thus, the side surfaces to which the bonding pads 22a and 22b are near are parallel to one another, with the signal routing layer 30 routing signals from one side of the die 18b to another side of the die 18b. An intra-chip wire bond 20a connects bonding pad 16b of die 18a to bonding pad 22a of die 15b. Finally a bonding wire 20b connects the bonding pad 22b to lead 14a. In this manner, signals from the die 18a at the bonding pad 16b can be electrically connected to the lead 14a, without "crossing" over the die 18b.

Figure 3:
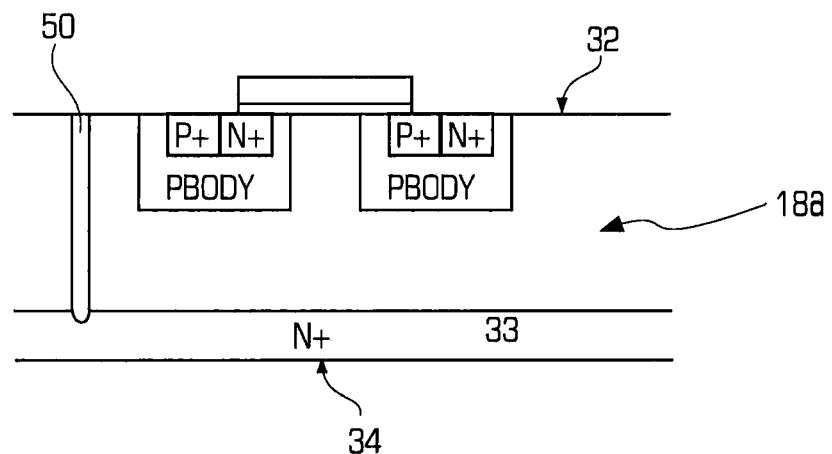
FIG. 3 is a cross-sectional view of a semiconductor die with a doped polysilicon trench of the present invention to connect to a buried layer.

In another aspect of the present invention, one of the dies, such as die 18a can contain a vertical circuit element, such as a vertical DMOS transistor. Referring to FIG. 3 there is shown a cross-sectional view of a die 18a with a vertical circuit element, such as a vertical DMOS transistor. As noted hereinabove, typically, in a vertical circuit component, the bottom surface 34 of the die 18a is a doped layer 33. As shown in FIG. 3, the doped layer of the die 18a is a N+ layer 33. In another aspect of the present invention, because the bottom surfaces 34 of the dies 18a and 18b are attached to the surface 12 of the die attach pad by a non-conductive adhesive 24, the bottom surfaces 34 will not short one another. However, there remains the problem of routing the signal connection to the doped layer 33 along the bottom surface 34. In the present invention, this is achieved by the use of a vertical trench 50 cut in the die 18a but filled with doped polysilicon. Typically, the doped layer 33 is the drain of a vertical transistor, such as a bipolar transistor. In the prior art, to package a multi-chip module in which one of the dies has a vertical transistor, the connection to the drain 33 is done by connecting the die with its bottom surface 34 on a printed circuit board (PCB) substrate and then routing the signal on the PCB to the other die. With the present invention, a trench 50 filled with doped polysilicon connects to the drain 33, and then with the connection to the trench 50 can be made on the same front surface 32 of the die 18a as the rest of the electrical connections. Further, using the intra-chip signal routing path 30 described hereinabove, the signal from the drain 33 can be routed to virtually any of the leads in the die attach pad.

Figure 4A:
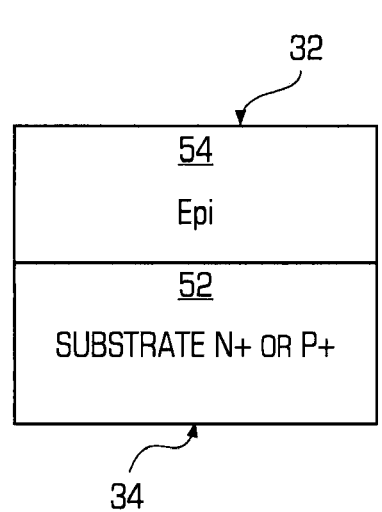
FIG. 4(a) is a cross-sectional view of a first embodiment of a die with which the polysilicon trench of the present invention may be used.
Figure 4B:
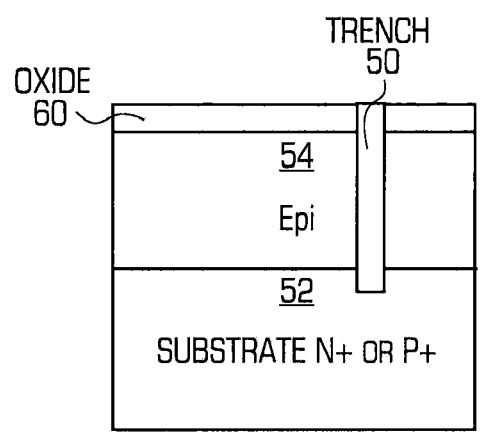
FIG. 4(b) is a cross-section view of the trench of the present invention connected to the substrate in the die shown in FIG. 4(a).

Referring to FIG. 4(a) there is shown a cross-sectional view of a die 18 with which the trench 50 of the present invention may be used. The die 18a comprises a single crystalline substrate 52, such as single crystalline silicon (although other complex single crystalline compounds, such as GaAs, may also be used). The substrate 52 is typically doped with P type or N type to render it conductive to act as the bottom most layer of a vertical device, such as a bipolar transistor, with the bottom surface 34 of the die 18a being the bottom of the substrate 52, A layer 54 of silicon is epitaxially grown on the substrate 52. Because the layer 54 is epitaxially grown, it will also be single crystalline, and will match the crystalline lattice structure of the substrate 52. The top surface of the epitaxial layer 54 forms the top surface 32 of the die 18a. A layer 60 of silicon (di)oxide or other insulator is grown or deposited on the top surface 32. A trench 50 is cut into the die 18a, through the oxide layer 60, through the epitaxial layer 54 and into the substrate 52. The trench 50 can be cut by well known techniques such as first forming a mask with a photoresist to cut into the oxide layer 60. Thereafter using the exposed portion of the photoresist and the oxide 60 as a mask, the epitaxial layer 54 is cut anisotropically by reactive ion etch into the substrate 52. Polysilicon is then deposited into the trench 50. The polysilicon in the trench 50 is then doped with a dopant to render it conductive. The doping can be done by ion implant or by diffusion or may be doped in-situ with the deposition of the polysilicon in the trench 50. The level of doping of the polysilicon in the trench 50 can be controlled to match the doping level of the substrate 52 to which electrical contact is desired to be made. Alternatively, a thin layer of LPCVD (Low pressure Chemical Vapor Deposition) polysilicon is first deposited into the trench 50. It is then doped to either N+ or P+ to match the dopant type and concentration of the substrate layer 52. Thereafter a second layer of LPCVD of polysicliocn can then be deposited into the trench 50 filling it. This second deposition of LPCVD can be doped to a level slightly different than the first layer of LPCVD polysilicon. The resultant structure is shown in FIG. 4(b).

Referring to FIG. 5(a) there is shown a cross-section view of another die 18a with which the trench 50 of the present invention may be used for isolation purpose. The die 18a shown in FIG. 5(a) is similar to the die shown in FIG. 4(a). The die 18a shown in FIG. 5(a) comprises a layer of single crystalline substrate 52 of a first conductivity type. A buried layer % is formed by selectively implanting the substrate 52 to a second conductivity type. An epitaxial layer 54 is then grown on the substrate 52. The epitaxial layer 54 is of the same conductivity as the substrate 52. Due to subsequent thermal processing, dopants of the second conductivity in the buried layer 56 will subsequently migrate into the epitaxial layer 54. Thus, the buried layer 56 is not a different layer, but is simply portions of the epitaxial layer 54 and the substrate 52 doped to form the connection to the vertical circuit element. In addition, the buried layer 56 does not extend along the entire epitaxial layer 54/substrate 52 interface. Similar to the embodiment shown in FIGS. 4(a) and 4(b) described hereinabove, trenches 50 are then cut into the oxide layer 60 through the epitaxial layer 54 and into the buried layer 56. The trenches 50 are then filled with polysilicon, doped to the same conductivity type as the buried layer 56 to make electrical contact with the buried layer 56.

Finally, referring to FIG. 6(a), there is shown a cross-section view of another embodiment of a die 18a for use with the trench 50 of the present invention. The die 18a shown in FIG. 6(a) is similar to the die 18a shown in FIG. 5(a), and comprises a substrate 52, with an epitaxial layer 54, and a buried layer 56 therebetween. Unlike the embodiment shown in FIG. 5(a), however, in the embodiment shown in FIG. 6(a), the buried layer 56 extends across the entire interface region between the epitaxial layer 54 and the substrate 52. Referring to FIG. 6(b) there is shown a cross section view of the die 18a with the trench 50 made through the oxide layer 60, the epitaxial layer 54 and into the buried layer 56. The trench 60 is then filled with doped polysilicon to make an electrical connection to the buried layer 56.

With the trench 50 of the present invention, because the trench 50 is filled with the same material (silicon) as the material through which the trench 50 is made (epitaxial layer 54, and the buried layer 56 or the substrate 52), there is no material incompatibility between the trench 50 and the layers 54/56/52. Further, a doped polysilicon trench 50 of the present invention may also be used as an isolation structure to electrically isolate a one circuit component, such as a vertical component from other electrical components in the integrated circuit die.

What is claimed is:

1. A circuit module comprising:
    a die attach pad having a surface and a plurality of leads surrounding the surface;
    a nonconductive adhesive on said surface;
    a first electronic circuit die, having a top surface and a bottom surface with said bottom surface directly on said nonconductive adhesive, said top surface having a plurality of bonding pads, wherein the first electronic circuit die has at least one routing path of a conductive material connecting a first bonding pad to a second bonding pad, wherein said routing path is on said top surface of said first electronic circuit die;
    a second electronic circuit die, having a top surface and a bottom surface with said bottom surface directly on said nonconductive adhesive, said top surface having a plurality of bonding pads;
    a first bonding wire connecting a bonding pad of the second electronic circuit die to the first bonding pad of the first electronic circuit die;
    a second bonding wire connecting the second bonding pad of the first electronic circuit die to a lead,
    wherein said first electronic circuit die has an electronic circuit component having a first terminal in said first electronic circuit die on said bottom surface of said first electronic circuit die,
    wherein said second electronic circuit die has an electronic circuit component having a second terminal in said second electronic circuit die on said bottom surface of said second electronic circuit die,
    wherein each of said first or second electronic circuit die is made of a substantially single crystalline silicon and further comprises:
    a trench filled with doped polysilicon with said trench extending from said top surface to said terminal,
    wherein said doped polysilicon extends from said top surface to directly contact said terminal.

2. The module of claim 1 wherein said electronic circuit component is a vertical transistor with said terminal being a doped layer in said first and second electronic die near said bottom surface.

3. The module of claim 2 wherein said trench is formed by an etch process.

4. The module of claim 3 wherein said polysilicon in said trench is doped by diffusion.

5. The module of claim 2 wherein said doped layer is a buried layer.

6. The module of claim 2 wherein said doped layer is along the bottom surface.

* * * * *